United States Patent [19]

de Cesare et al.

[11] Patent Number: 5,682,037
[45] Date of Patent: Oct. 28, 1997

[54] THIN FILM DETECTOR OF ULTRAVIOLET RADIATION, WITH HIGH SPECTRAL SELECTIVITY OPTION

[75] Inventors: Giampiero de Cesare; Fernanda Irrera; Fabrizio Palma, all of Rome, Italy

[73] Assignee: Universita Degli Studi Di Roma "La Sapienza", Rome, Italy

[21] Appl. No.: 588,110

[22] Filed: Jan. 18, 1996

[30] Foreign Application Priority Data

Feb. 9, 1995 [IT] Italy ............... RM95A0073

[51] Int. Cl.$^6$ ........................... H01L 27/14
[52] U.S. Cl. ............... 250/372; 250/370.01; 257/55; 257/56; 257/62; 257/63; 257/458; 257/53; 257/77
[58] Field of Search ............ 250/372, 370.01, 250/370.06; 257/55, 56, 62, 63, 458, 53, 77

[56] References Cited

U.S. PATENT DOCUMENTS

| | | | |
|---|---|---|---|
| 4,177,474 | 12/1979 | Ovshinsky | 257/55 |
| 4,217,598 | 8/1980 | D'Auria et al. | 257/458 |
| 4,329,699 | 5/1982 | Ishihara et al. | 257/55 |
| 4,469,715 | 9/1984 | Madan . | |
| 4,772,933 | 9/1988 | Schade | 257/458 |
| 4,839,240 | 6/1989 | Shimizu et al. . | |
| 4,857,115 | 8/1989 | Iwamoto et al. | 257/53 |
| 5,015,838 | 5/1991 | Yammagishi et al. | 257/458 |
| 5,073,809 | 12/1991 | Bigan et al. | 257/458 |
| 5,097,306 | 3/1992 | Tokuda | 257/458 |
| 5,210,766 | 5/1993 | Winer et al. | 257/53 |
| 5,282,993 | 2/1994 | Karg | 257/56 |
| 5,311,047 | 5/1994 | Chang | 257/55 |
| 5,414,275 | 5/1995 | Sugawa et al. | 257/458 |
| 5,557,133 | 9/1996 | De Cesare et al. | 257/458 |

Primary Examiner—Michael J. Tokar
Assistant Examiner—Virgil O. Tyler
Attorney, Agent, or Firm—Herbert Dubno

[57] ABSTRACT

Thin film detector of ultraviolet radiation with high spectral selectivity option, and a structure placed between two electrodes, formed by the superposition of semiconductor thin films such as hydrogenated amorphous silicon and its alloys with carbon. The device is able to absorb a large quantity of UV radiation and to convert it into electric current being transparent to photons of longer wavelengths. Its deposition technique allows fabrication on substrates of glass, plastic, metal, ceramic types of materials (also opaque, also flexible), on which a conductor material film has been predeposited. It can be fabricated on substrates of any size.

4 Claims, 3 Drawing Sheets

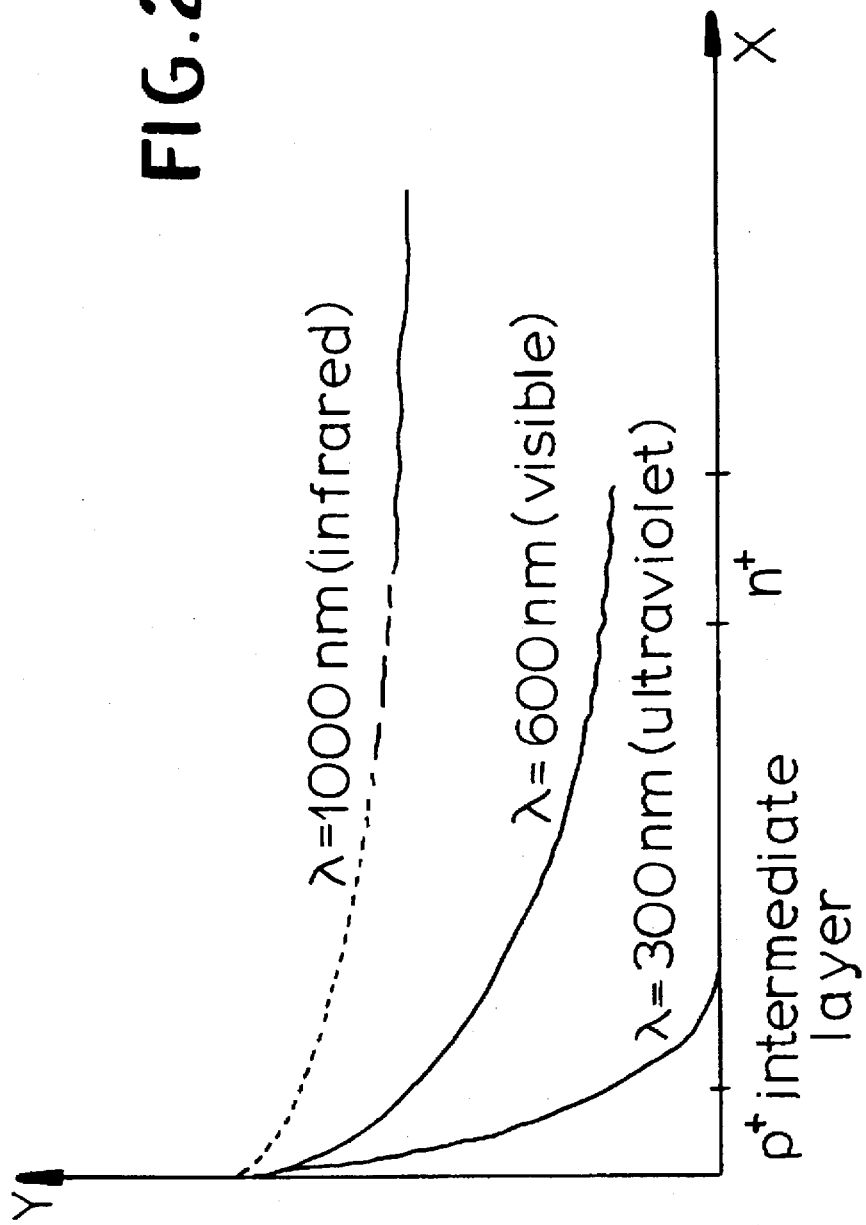

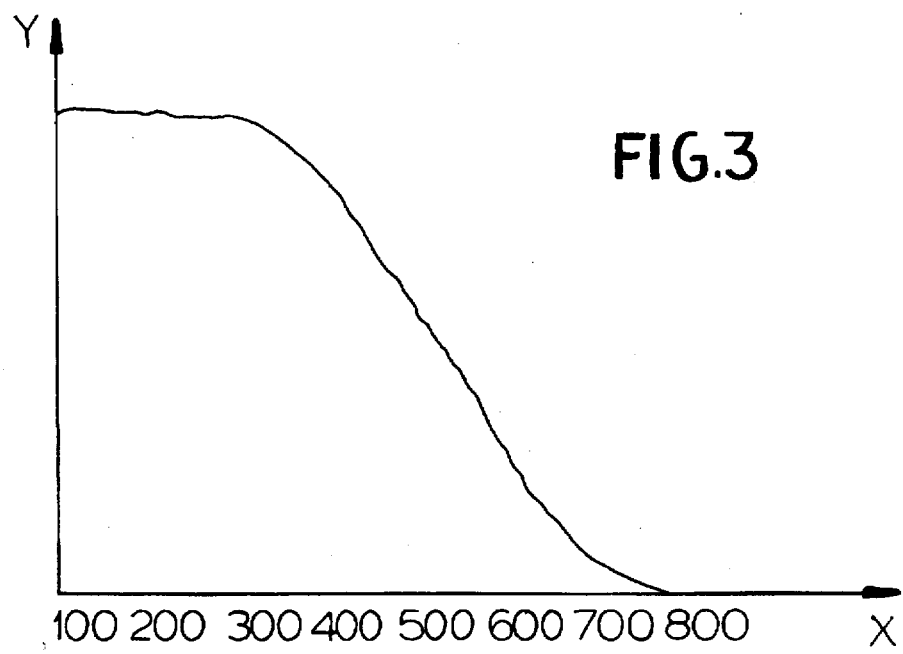
X- radiation wavelength
Y- quantum efficiency
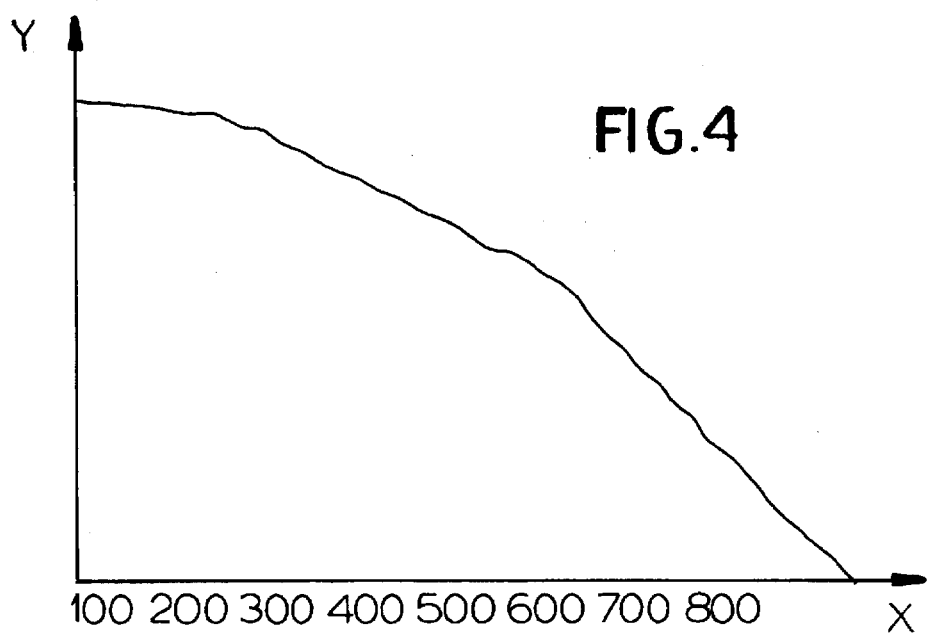
X- radiation wavelength
Y- quantum efficiency

THIN FILM DETECTOR OF ULTRAVIOLET RADIATION, WITH HIGH SPECTRAL SELECTIVITY OPTION

FIELD OF THE INVENTION

Our present invention relates to a sensor that permits detection of ultraviolet light (UV. with $\lambda < 400$ nm with high rejection of radiation of longer wavelengths.

SUMMARY OF THE INVENTION

The photodetector of the invention comprises a $p^+$–$n^+$ junction of hydrogenated amorphous silicon-carbon alloy (a-SiC:H) between two electrodes connected with the exterior and which is fabricated by thin film technology. The temperatures during the whole fabrication process are such that the photodetector can be made on any substrate such as glass, plastic and metal. Thanks to the technology used, fabrication is possible in the form of large-area, high resolution two-dimensional matrixes.

The present invention, therefore, is in the field of UV radiation detection and finds application in the detection of ultraviolet components of light on an unwanted background of visible and/or infrared radiation which should be filtered through in a case in which a high spatial resolution of a two-dimensional image is necessary.

The invention can be used to detect phenomena accompanied by emission of light: for example in instrumentation for detection of astronomic and astrophysical data: in instrumentation for control of reactions in chemical and biological fields; and in ionized gas spectroscopy (fusion plasma and electric shock plasma: for clinical diagnostics, etc.).

It can be employed in the development of:

detection systems with one window functioning in the ultraviolet spectrum and with one or two additional windows functioning in other spectral regions;

ultraviolet radiation detection systems with high rejection of radiation at long wavelengths;

large-area high resolution matrix systems capable of detection in the ultraviolet spectral range.

The focal point of the invention is its capacity for absorbing a large quantity of ultraviolet radiation and converting it into electric current, letting the photons of other spectral ranges pass unhindered. In this invention the UV light absorption is made possible by the following factors:

the frontal electrode is a metal grid which offers to the incident light open areas through which the light can pass;

the UV that passes through these open areas is absorbed in the $p^+$ layer and converted into electric charge carriers; and the electrons photogenerated in the $p^+$ can reach the rear electrode, crossing the entire structure.

Selectivity in the ultraviolet range is possible if the thickness of the detector is much below the dimension at which there is a strong absorption of the visible and infrared radiation.

BACKGROUND OF THE INVENTION

Currently some highly sensitive ultraviolet light photodetectors are commercially available. These UV detectors can be divided into two categories: (a) single-channel detectors, for a punctual (point) detection and (b) multi-channel detectors for a two-dimensional (linear) detection. The single-channel detectors include photomultiplier tubes and the crystalline silicon photodiodes. Multi-channel detectors are: crystalline silicon photodiode arrays, charge-coupled devices (CCD) and multi-channel plates (MCP). The well-known photomultiplier tubes permit the detection of ultraviolet radiation with high sensitivity and selectivity with respect to the visible part of the spectrum by appropriately selecting the cathode material. However, the use of photomultipliers has a number of disadvantages which are overcome by the present invention. In fact, photomultipliers require typical power supply voltages exceeding one thousand volts. They are vacuum tubes, difficult to handle, bulky and do not allow the integration of several elements.

Crystalline silicon photodiodes have an optimum efficiency in the visible spectral range but can allow the detection of ultraviolet radiation only after sophisticated and expensive mechanical and optical processing. They require low power supply voltages and can be integrated in arrays of a few centimeters in size.

The UV-CCD's are crystalline silicon components for which very special processing is necessary as well. They are multi-channel detectors which are highly sensitive with high signal/noise (S/N) ratios, especially if they work at low temperatures. Basically CCD's are analog linear shift registers. The electrons photogenerated within the silicon are collected in a matrix of pixels which are then read sequentially. The two-dimensional image can thus be reconstructed. There are at least three major disadvantages in detection of ultraviolet radiation by CCD's namely, the cost the impossibility to provide large-area two-dimensional matrixes and the necessity to filter the visible radiation in the case that ultraviolet components must be detected against background of other radiation.

The Micro-Channel Plates (MCP) amplify even very weak light signals, through a cascade multiplication process. They consist of millions of microscopic conductive glass tubes used fused together in a disc-form base, to the heads of which is applied a high potential difference (typically of 1,000 V). The MCP's can function as image intensifiers or as photon counters and, thus, have an excellent sensitivity. They are provided at the input stage, with the deposition of a selective sensitivity photocathode and at the output stage, with a phosphorous shield. Due to their high sensitivity and S/N ratio performances, MCP's are used in space applications and in astrophysics. However, the wide commercialization of MCP's has encountered difficulty because of the high cost of the MCP due to the technological complexity and need for the 1,000 V power supply.

ADVANTAGES OF THE INVENTION

With respect to the commercial UV photodetectors, the invention solves the problems of filtering of the background visible and infrared radiation; electric power consumption; large areas integration and, in addition, is less costly.

The invention allows optimization of the thicknesses and coefficients of absorption of the amorphous semiconductor layers composing the junction, as well as of the geometry of the metal grid that serves as the front electrode. Besides increasing the maximum detection efficiency in the UV, this optimization allows also tuning of the operating band of the detector by shifting it toward the near UV radiation or toward the far UV radiation, depending on the applications. In fact, it had already been demonstrated by other researchers that, by acting on the deposition parameters and on the type and concentration of impurities in the silicon alloy, absorption could be enhanced in the visible range toward the UV or toward the infrared radiation. Thus the physical parameters to be optimized are: a) the absorption profile and b) the thickness of the detector. This optimization can be obtained by the control of the deposition parameters, namely, the deposition time and the percentage of carbon in the alloy.

The optimization and the reproducibility of the thicknesses of the layers is made possible by control of the Glow Discharge time of deposition the other parameters being fixed. The coefficients of absorption of the hydrogenated amorphous silicon allow instead depend upon the fundamental properties of the material such as, the extension of the energy and optical gap of the semiconductor and the density of the defect states in the gap. These, in turn, depend upon the growth parameters in a very complicated way. A simple and repeatable method for varying the absorption coefficient profile as a function of the wavelength is to form silicon/carbon or silicon/germanium alloys in known percentages. This is obtained through the introduction of a controlled flow, respectively, of methane or germanium gas in the deposition chamber. The resultant carbon/silicon alloy is an amorphous semiconductor of a greater energy gap than the amorphous silicon, which penalizes the absorption of the visible and of the infrared with respect to the ultraviolet radiation.

However, the a-SIC alloy to be used in the device must not contain too high percentages of carbon with respect to silicon because its electronic properties would prove poor.

BRIEF DESCRIPTION OF THE DRAWING

The above and other objects, features, and advantages will become more readily apparent from the following description, reference being made to the accompanying drawing in which:

FIG. 2 is a graph showing light intensity versus distance from the surface exposed to radiation for three sample wavelengths;

FIG. 3 is a graph of quantum efficiency versus radiation wavelength for a high selectivity detector according to the invention; and FIG. 4 is a graph similar to FIG. 3 of a detector having high sensitivity also in the visible range.

SPECIFIC DESCRIPTION

Figure 1A:
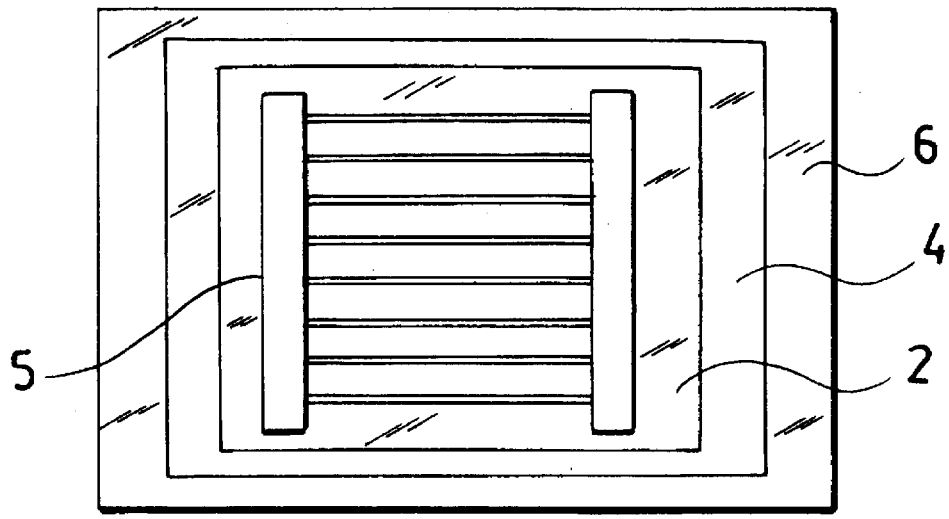
FIG. 1a is a plan view of a UV detector according to the invention.

From FIG. 1a the various layers on the substrate 6 can be seen and the model grid 5 is likewise visible. The substrate 6 is a transparent element which can be glass, quartz, etc.

Figure 1B:
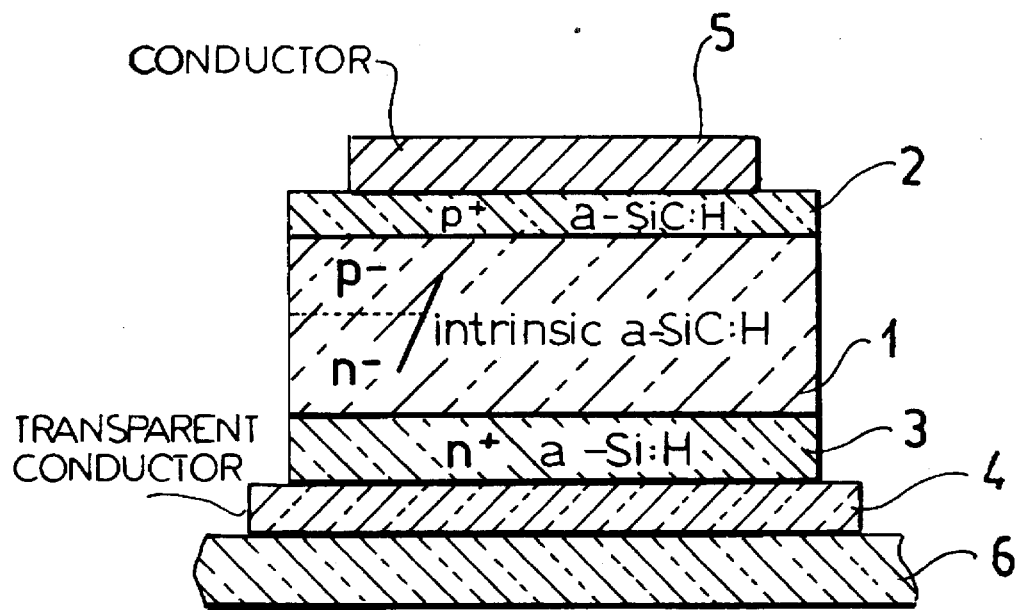
FIG. 1b is a cross sectional view through this detector.

From FIG. 1b, it will be apparent that above the transparent conductor 4 on the substrate 6 and between the transparent conductor 4 and the conductor 5 in the form of the model grid, a rectifying Junction is provided which comprises, in succession the $p^+$ amorphous hydrogenated and carbon-containing silicon layer 2, the intrinsic amorphous hydrogenated and carbon-containing silicon layer 1 and the $n^+$ amorphous hydrogenated silicon layer 3.

FIGS. 1a and 1b show an intermediate layer between two $p^+$ and $n^+$ amorphous silicon doped layers, for the purpose of forming the rectifying junction. This intermediate layer must have a very slight defect state this is obtained, for example, by using a low doping or undoped (intrinsic) layer so as to form, respectively, a $p^+$-$p^-$$n^-$-$n^+$ or a $p+$-i-$n^+$ structure. In the case of the $p^+$-i-$n^+$ detector, the application of a reverse polarization may not be effective, because the junction would be crossed by a significant dark current due to microscopic short circuits which would penalize the relationship between photocurrent and dark noise. The presence of a significant inverse saturation current is typical of very thin and defect p-i-n diodes in a Si:H. From these considerations, a better operation of the device in question is to be expected in terms of S/N ratio, with polarization voltages around zero.

Concerning FIG. 1b, it must be borne in mind that the real dimensions of the layers will be qualitatively discussed below. In the drawing the relationships between dimensions have not been maintained.

In observing FIG. 1a, it noted that the electromagnetic radiation penetrates into the amorphous device through the open regions of the metal grid and crosses serially the following layers (FIG. 1b): layer 2, $p^+$ of a-SiC:H; layer 1, intrinsic or p-/n- of a-SiC:H; layer 3, $n^+$ of a-Si:H. The order of the various layers composing the device is reversible in case of use of a substrate transparent to the UV light, such as quartz, magnesium fluoride or the like. In this case, the structure becomes: substrate, metal grid, $p^+$-$n^+$ junction with the previously described intermediate layer, rear electrode.

However, the first active layer is the $p^+$ layer (which we will call the window layer). Based on the typical values of the absorption coefficients provided in the literature it is found that, in a $p^+$ layer of a-SiC:H with 50% percent of carbon, all the ultraviolet radiation is absorbed essentially in the first 5 nm (FIG. 2). This dimension is of the same order as the diffusion length of the electrons (minority carriers) in that material. Hence, by dimensioning the thickness of the $p^+$ layer around this value there is a good probability for collection of the electron-hole pairs photogenerated in the $p^+$ layer after the absorption of the UV. Smaller thicknesses of the $p^+$ layer are technologically inadvisable as they worsen the quality of the junction whereas greater a-SiC:H thicknesses would penalize collection of carriers and, consequently, the photocurrent. Greater thicknesses could be considered if the $p^+$ layer of an a-SiC:H alloy less rich in carbon could be considered, since the diffusion length is greater. In this case the transparency to the visible would be less (and selectivity as well).

The high value of the energy gap of the $p^+$ layer (also exceeding 2 eV) enhances transmission of the visible radiation which, thus, in negligibly absorbed in the $p^+$ layer.

The holes photogenerated in the $p^+$ by the UV light are collected by the metal grid electrode. The electrons photogenerated in the $p^+$ layer diffuse and reach the $n^+$ layer, where they are the majority carriers and, thus, are collected by the rear electrode. In the intermediate layer the electrons move by effect of the external voltage or of the contact potential, having specified that this photodetector may or may not be polarized, depending on the structure chosen.

By fixing the thickness of the intermediate a-SiC:H layer as on the order of some tens of nanometers the collection probability is high. The visible radiation is absorbed in the intermediate region in an amount that increases with the increase in thickness. With a thickness of some tens of nanometers a significant absorption is obtained of the portion of the visible spectrum adjacent to the ultraviolet radiation, i.e., of the blue (while the red would be so weakly absorbed as to cross almost unhindered through the a-SiC:H intermediate layer to arrive in layer $n^+$ and to escape through the transparent electrode and substrate).

The use of an intermediate layer of a-SiC:H decreases the absorption of the visible radiation and contributes to the selectivity of the detector by comparison with the case of an a-Si:H intermediate layer.

In the thick $n^+$ layer of a-Si:H the collection of photogenerated carriers is an event of negligible probability.

In other words, selectivity in the ultraviolet band is ensured by the following factors:

transparency of the $p^+$ layer to the visible light (a-SiC:H);

a low absorption profile in the visible range also in the intermediate layer (a-SiC:H);

the small thickness of the intermediate layer.

The high quantum efficiency in the ultraviolet radiation is ensured by the relationship between the open area and the opaque area in the metal grid and between thickness of the $p^+$ layer and length of diffusion of electrons.

From what has been said, a maximum sensitivity of the detector is obtained in the ultraviolet radiation which progressively decreases with the increase in wavelength, i.e. from the blue toward the red, with insignificant efficiency values in the infrared.

Let us clarify the meaning of maximum sensitivity in ultraviolet radiation. In principle, if the diffusion length in the $p^+$ layer was much greater than its thickness, all the carriers photogenerated in the $p^+$ would have a high probability of contributing to the photocurrent even those generated at the surface.

From literature it is known that the diffusion length of electrons in that material does not exceed a few nanometers. Thus, the sensitivity should decrease with wavelengths in the far UV range. Another mechanism takes place, which increases the collection probability of photocarriers with decreasing wavelengths, namely, the electron yield effect. This effect gives rise to the generation of more than one electron-hole couple after absorption of one photon if the photon energy greatly exceeds the energy gap of the semiconductor. For example, photons with a wavelength below 300 nm have energies greater than two times the energy gap of the a-SiC:H used in the $p^+$a layer, and can contribute to a multiple photogeneration mechanism. Considering all the effects mentioned above the sensitivity of the photodetector should remain constant over the entire UV band. And also in the far-ultraviolet and beyond.

FIG. 3 shows diagrammatically the expected quantum efficiency curve in arbitrary units for a structure like that shown in FIG. 1, calculated on the basis of the absorption relative to the various wavelengths and of the typical values provided in the literature of the transport constants of the semiconductors under study.

With this invention it is possible to produce also a photodetector with high spectral response in the UV and also in the visible region (i.e. of the type schematically represented in FIG. 4). In this case the structure is the following: $p^+$-i-$n^+$, modified according to the following criteria:

an intrinsic layer is deposited in a-Si:H instead of a-SiC:H to increase absorption of the visible;

its thickness is increased to a few hundred of nanometers as is used in a-Si:H solar cells where it is intended to absorb the visible; and a metal rear electrode is applied to reflect the still unabsorbed radiation and cause it to pass again into the active layer.

The deposition technique used for the photodetector permits fabrication on glass, plastic, metal and ceramic types of substrates (also opaque and flexible substrates) on which a conductor material film has been predeposited. In addition, this technique allows fabrication over any area even very large area surfaces if the deposition machine is set for large area work. Thus, by utilizing the concepts just expressed, large area, two-dimensional matrixes can be fabricated of the photodetectors (pixels) whose minimum dimension depends on external factors (the lithographic technique in use) and determines the spatial resolution. To this is added the fact that the thicknesses and profiles of absorption of the layers can be optimized so as to make the window functioning in the ultraviolet spectrum very selective. Furthermore, if the rear electrode and the substrate are transparent to the visible, a large part of the transmitted radiation can finally exit from the detector thereby enhancing selectivity. The thicknesses and profiles of absorption of the layers can be optimized so as to extend the operation of the detector to the visible. As mentioned earlier, to further increase the efficiency of detection in the visible, a metal rear electrode can be used which reflects radiation, making it pass through the intrinsic layer for the second time.

The present structure can be lengthened to a back-to-back diode structure (of the type: $p^+$-i-$n^+$-i-$p^+$), still composed of thin films of hydrogenated amorphous silicon and its alloys such that they present a second operation band in another spectral range. The back-to-back diode photodetector presents a second operation band at longer wavelengths, which can be in the infrared region if the second added diode is made of hydrogenated amorphous silicon-germanium alloy. The photodetector diode structure can be further lengthened to a $p^+$-i-$n^+$-i-$n^+$-i-$p^+$ structure (according to the information of Italian application corresponding to copending U.S. application Ser. No. 08/437,498, now U.S. Pat. No. 5,557,133). Also composed of thin films of hydrogenated amorphous silicon and its alloys which has a second and third operation bands centered at longer wavelengths under the polarization conditions explained in the above-mentioned patent.

We claim:

1. A photodetector effective in the ultraviolet region of the spectrum, comprising:

a substrate;

a first electrode on said substrate;

a second electrode spaced from said first electrode; and a stack between said electrodes of at least three thin-film layers forming a $p^+n^+$ rectifying junction and including in succession a $p^+$ amorphous hydrogenated and carbon-containing silicon layer photogenerating charge carriers upon illumination by light of said ultraviolet region, an intrinsic amorphous hydrogenated and carbon-containing silicon layer, and an $n^+$ amorphous hydrogenated silicon layer.

2. The photodetector defined in claim 1, further comprising an additional stack of thin films of hydrogenated amorphous silicon or amorphous hydrogenated and carbon-containing silicon layers responsive to a frequency band in a portion of the spectrum other than said ultraviolet region.

3. The photodetector defined in claim 2 wherein said frequency band has greater wavelengths than those of said ultraviolet region.

4. The photodetector defined in claim 1 wherein said stack has a $p^+$-i-$n^+$-i-$n^+$-i-$p^+$ structure.

* * * * *